United States Patent
Yoo et al.

(10) Patent No.: US 9,634,223 B2
(45) Date of Patent: Apr. 25, 2017

(54) SUPERCONDUCTOR, SUPERCONDUCTING WIRE, AND METHOD OF FORMING THE SUPERCONDUCTOR

(71) Applicants: SUNAM CO., LTD., Anseong-si, Gyeonggi-do (KR); SNU R&DB FOUNDATION, Seoul (KR)

(72) Inventors: Sang Im Yoo, Seoul (KR); Jung Woo Lee, Seoul (KR); Soon Mi Choi, Seoul (KR); Seung Hyun Moon, Seongnam-si (KR); Hun-Ju Lee, Yongin-si (KR); Jae Hun Lee, Osan-si (KR)

(73) Assignees: SUNAM CO., LTD., Anseong-si, Gyeonggi-do (KR); SNU R&DB FOUNDATION, Seoul (KR)

(*) Notice: Subject to any disclaimer, the term of this patent is extended or adjusted under 35 U.S.C. 154(b) by 0 days.

(21) Appl. No.: 14/696,074

(22) Filed: Apr. 24, 2015

(65) Prior Publication Data
US 2016/0012944 A1 Jan. 14, 2016

(30) Foreign Application Priority Data
Jul. 9, 2014 (KR) .................. 10-2014-0085927

(51) Int. Cl.
*H01L 39/24* (2006.01)

(52) U.S. Cl.
CPC ...... *H01L 39/2451* (2013.01); *H01L 39/2432* (2013.01)

(58) Field of Classification Search
CPC .................................. C04B 35/4508
USPC ................. 505/440, 441, 445, 446
See application file for complete search history.

(56) References Cited

U.S. PATENT DOCUMENTS

2012/0329658 A1* 12/2012 Moon ............... C04B 35/4508
505/230

FOREIGN PATENT DOCUMENTS

| JP | 2003-327496 A | 11/2003 | |
|----|---------------|---------|---|
| JP | 2013-519201 A | 5/2013 | |
| KR | 10-2007-0093050 A | 9/2007 | |
| KR | 10-2012-0079456 A | 7/2012 | |
| WO | WO 2011/096624 * | 8/2011 | ............. H01B 13/00 |

* cited by examiner

*Primary Examiner* — Paul Wartalowicz
(74) *Attorney, Agent, or Firm* — Lee & Morse, P.C.

(57) ABSTRACT

A super conductor is formed by a process including a first step of forming liquid-phase rare earth-copper-barium oxide by heat treating a superconductor precursor including a rare earth element, barium, and copper, a second step of forming a first superconductor of the rare earth-copper-barium oxide that is epitaxially grown from the liquid-phase rare earth-copper-barium oxide, and a third step of forming a second superconductor of the rare earth-copper-barium oxide by heat treating the first superconductor, wherein the heat treatment of the third step is performed in an atmosphere in which the rare earth-copper-barium oxide has no liquid phase.

17 Claims, 20 Drawing Sheets

SUPERCONDUCTOR, SUPERCONDUCTING WIRE, AND METHOD OF FORMING THE SUPERCONDUCTOR

CROSS-REFERENCE TO RELATED APPLICATIONS

This U.S. non-provisional patent application claims priority under 35 U.S.C. §119 of Korean Patent Application No. 10-2014-0085927, filed on Jul. 9, 2014, the entire contents of which are hereby incorporated by reference.

BACKGROUND

The present invention disclosed herein relates to superconductors.

A large amount of current may flow in a superconductor because its electrical resistance almost disappears at low temperature (near 0K). Recently, researches for a second-generation high-temperature superconductor (coated conductors), in which superconductor is formed on a thin buffer layer or metal substrate having a biaxially aligned textured structure, has been actively conducted. The second-generation high-temperature superconductor may be applied to various fields. For example, a wire using the second-generation high-temperature superconductor may have a much better current carrying capacity per unit area than a typical metal wire. The wire using the second-generation high-temperature superconductor may reduce power loss of a power device, and may be used in areas such as magnetic resonance imaging (MRI), a superconductor magnetic levitation train, and a superconducting propulsion ship.

SUMMARY

The present invention provides a superconductor including flux pinning centers.

The present invention also provides a superconducting wire including flux pinning centers.

The present invention also provides a method of forming a superconductor including flux pinning centers.

Embodiments of the present invention provide methods of forming a superconductor including: providing a superconductor precursor including a rare earth element, barium, and copper; performing a pre-annealing process on the superconductor precursor to form a first superconductor in which rare earth-copper-barium oxide is epitaxially grown; and performing a post-annealing process on the first superconductor to form a second superconductor, wherein the pre-annealing process includes: a first heat treatment step in which the rare earth-copper-barium oxide has a liquid phase containing grains of rare earth oxide; and a second heat treatment step in which the rare earth-copper-barium oxide is epitaxially grown by cooling the liquid-phase rare earth-copper-barium oxide at a lower temperature than that of the first heat treatment step, and the post-annealing process is performed at a lower temperature than that of the first heat treatment step.

In some embodiments, the first heat treatment step may be performed at an oxygen partial pressure of $10^{-6}$ Torr to $10^{-1}$ Torr and a temperature of 800° C. or more.

In other embodiments, the second heat treatment step may be performed at an oxygen partial pressure of $10^{-2}$ Torr to $10^{-1}$ Torr and a temperature of 800° C. or less.

In still other embodiments, the post-annealing process may be performed in a temperature range of 700° C. to 800° C. under an oxygen partial pressure of $10^{-3}$ Torr or more.

In even other embodiments, the rare earth-copper-barium oxide of the epitaxially grown first superconductor may be formed from the rare earth oxide.

In yet other embodiments, the first superconductor may include grains of rare earth oxide that are dispersed therein.

In further embodiments, the second superconductor may include grains of rare earth oxide that are dispersed therein and stacking faults of copper oxide.

In still further embodiments, the rare earth oxide is $RE_2O_3$, the first superconductor has a $RE_{1+x}Ba_{2-x}Cu_3O_{7-\delta}$ phase, the second superconductor has a $RE_{1+y}Ba_{2-y}Cu_3O_{7-\delta}$ phase, and x>y, wherein RE may include yttrium (Y) or at least one of lanthanide elements including lanthanum (La), neodymium (Nd), samarium (Sm), europium (Eu), gadolinium (Gd), terbium (Tb), dysprosium (Dy), holmium (Ho), Erbium (Er), thulium (Tm), ytterbium (Yb), and lutetium (Lu).

In even further embodiments, the second superconductor may further include $RE_2BaCuO_5$.

In yet further embodiments, the rare earth-copper-barium oxide may be formed on a tape-shaped substrate, and the substrate may include an oxide buffer layer formed on a metal substrate having a textured structure.

In other embodiments of the present invention, methods of forming a superconductor including: a first step of forming liquid-phase rare earth-copper-barium oxide by heat treating a superconductor precursor including a rare earth element, barium, and copper; a second step of forming a first superconductor of the rare earth-copper-barium oxide that is epitaxially grown from the liquid-phase rare earth-copper-barium oxide; and a third step of forming a second superconductor of the rare earth-copper-barium oxide by heat treating the first superconductor, wherein the heat treatment of the third step is performed in an atmosphere in which the rare earth-copper-barium oxide has no liquid phase.

In still other embodiments of the present invention, superconductors including: rare earth-barium-copper oxide having a single crystal structure; grains of rare earth oxide that are included in the rare earth-barium-copper oxide; and stacking faults of copper oxide that are included in the rare earth-barium-copper oxide and are stacked by being aligned in a c-axis direction of the rare earth-barium-copper oxide having a single crystal structure.

In some embodiments, the rare earth oxide is $RE_2O_3$ and the rare earth-barium-copper oxide has a $RE_{1+y}Ba_{2-y}Cu_3O_{7-\delta}$ phase, wherein RE may include yttrium (Y) or at least one of lanthanide elements including lanthanum (La), neodymium (Nd), samarium (Sm), europium (Eu), gadolinium (Gd), terbium (Tb), dysprosium (Dy), holmium (Ho), Erbium (Er), thulium (Tm), ytterbium (Yb), and lutetium (Lu).

In other embodiments, the superconductor may further include rare earth-barium-copper oxide having a $RE_2BaCuO_5$ phase.

In even other embodiments of the present invention, superconducting wires including: a substrate; and a thin film of a superconductor that is formed on the substrate, wherein the thin film of the superconductor may include epitaxially grown rare earth-barium-copper oxide; grains of rare earth oxide that are included in the rare earth-barium-copper oxide; and stacking faults of copper oxide that are included in the rare earth-barium-copper oxide and are stacked by being aligned in a c-axis direction of the epitaxially grown rare earth-barium-copper oxide.

In some embodiments, the substrate may include an oxide buffer layer formed on a metal substrate having a textured structure.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE EMBODIMENTS

Figure 1:
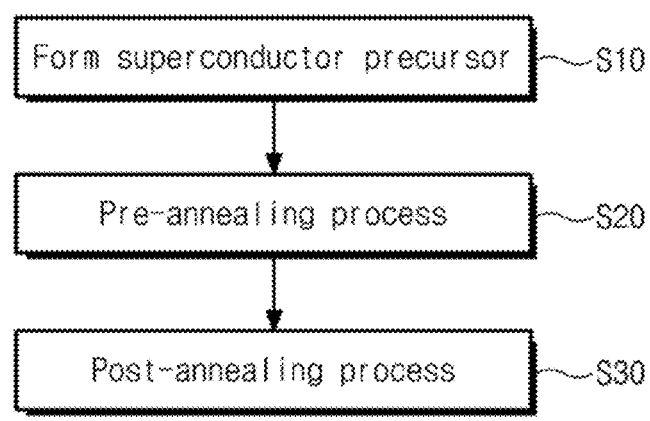
FIG. 1 is a flowchart illustrating a method of forming a superconductor according to embodiments of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Since preferred embodiments are provided below, the order of the reference numerals given in the description is not limited thereto.

In the following embodiments, GdBCO is described as an example of a superconductor, but the present invention is not limited thereto. The GdBCO denotes $RE_{1+x}Ba_{2-x}Cu_3O_{7-\delta}$ ($0<x<1$, $0<\delta<1$). Hereinafter, the present invention will be described in more detail.

FIG. 1 is a flowchart illustrating a method of forming a superconductor according to embodiments of the present invention. Referring to FIG. 1, the method of forming a superconductor according to the embodiments of the present invention may include a process of forming a superconductor precursor layer on a substrate (S10), a pre-annealing process of forming an epitaxial superconductor (S20), and a post-annealing process of improving performance of the epitaxially grown superconductor (S30).

Figure 2A:
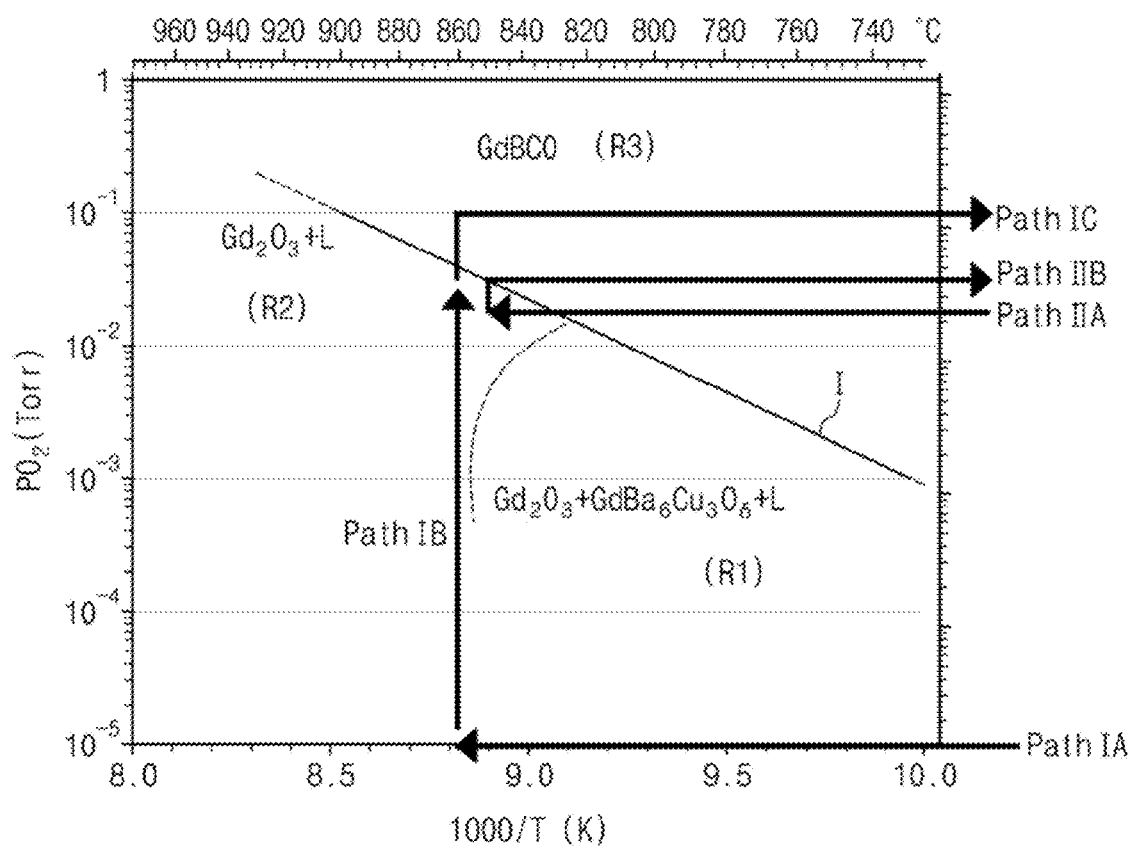
FIG. 2A illustrates a phase diagram of GdBCO and an example of a pre-annealing process according to the present invention.
Figure 2B:
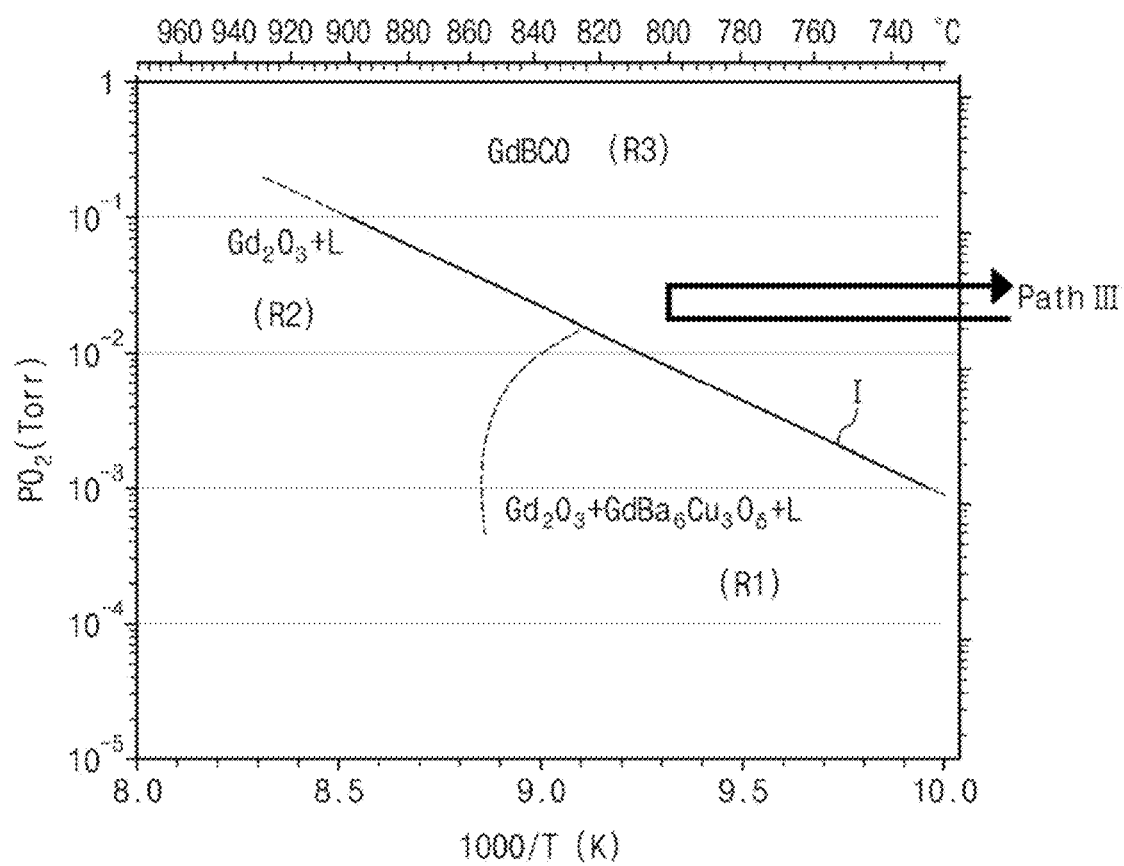
FIG. 2B illustrates a phase diagram of GdBCO and an example of a post-annealing process according to the present invention.

FIG. 2A illustrates a phase diagram of GdBCO and an example of a pre-annealing process according to the present invention. FIG. 2B illustrates a phase diagram of GdBCO and an example of a post-annealing process according to the present invention.

Referring to FIGS. 2A and 2B, a first region R1 may be in a state of an oxygen partial pressure of about $10^{-2}$ Torr or less and a temperature of 850° C. or less. A second region R2 may be in a state of an oxygen partial pressure of about $10^{-1}$ Torr to about $10^{-2}$ Torr or less and a temperature of 850° C. or more. A third region R3 may be in a state of a higher oxygen partial pressure than the first region R1 and the second region R2. The third region R3 and the first and second regions R1 and R2 may be separated by boundary I. In the first region R1, it may be understood that GdBCO has $Gd_2O_3$, $Gd Ba_6Cu_3O_{7-\delta}$ ($0<\delta<1$), and a liquid phase. Herein, the liquid phase is in a liquid state in which barium (Ba), copper (Cu), and oxygen (O) are main components and gadolinium (Gd) is dissolved therein. In the second region R2, it may be understood that GdBCO has $Gd_2O_3$ and a liquid phase. In the third region R3, it may be understood that GdBCO has an epitaxial GdBCO.

FIGS. 3 to 7 and 12 are cross-sectional views illustrating the method of forming a superconductor according to the embodiments of the present invention. Referring to FIGS. 2 to 7 and 12, the method of forming a superconductor according to the embodiments of the present invention will be schematically described.

Figure 3:
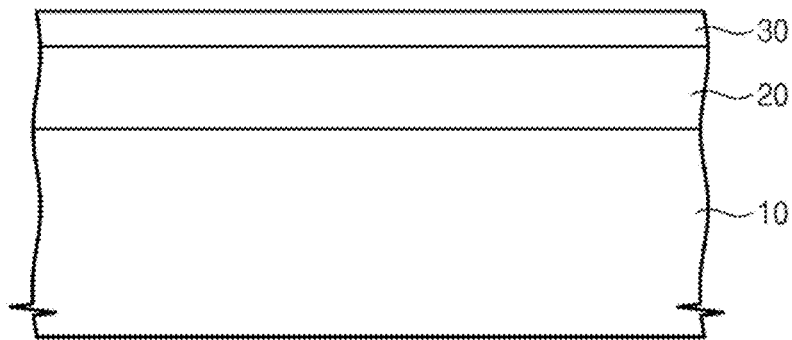
FIGS. 3 to 7 and 12 are cross-sectional views illustrating the method of forming a superconductor according to the embodiments of the present invention.

Referring to FIG. 3, a substrate 10 is provided. The substrate 10 may have a biaxially aligned textured structure. The substrate 10, for example, may be a metal substrate. The metal substrate may be formed of a cubic metal such as rolled annealed nickel (Ni), a Ni-based alloy (Ni—W, Ni—Cr, Ni—Cr—W, etc.), stainless steel, silver, a silver alloy, and a Ni-silver composite. The substrate 10 may have a plate shape or a tape shape for a wire.

An ion-beam assisted deposition (IBAD) layer 20 may be formed on the substrate 10. The IBAD layer 20 may include a diffusion barrier layer (e.g., $Al_2O_3$), a seed layer (e.g., $Y_2O_3$), and a MgO layer which are sequentially stacked. The IBAD layer 20 may be formed by an IBAD method. An epitaxially grown homoepi-MgO layer may be further formed on the MgO layer. A buffer layer 30 may be formed on the IBAD layer 20. The buffer layer 30 may include $LaMnO_3$, $LaAlO_3$, $CeO_2$, or $SrTiO_3$. The buffer layer 30 may be formed by a sputtering method. The IBAD layer 20 and the buffer layer 30 may prevent the reaction between the substrate 10 and a superconducting material thereon and may transfer the crystallinity of the biaxially aligned textured structure.

Figure 4:
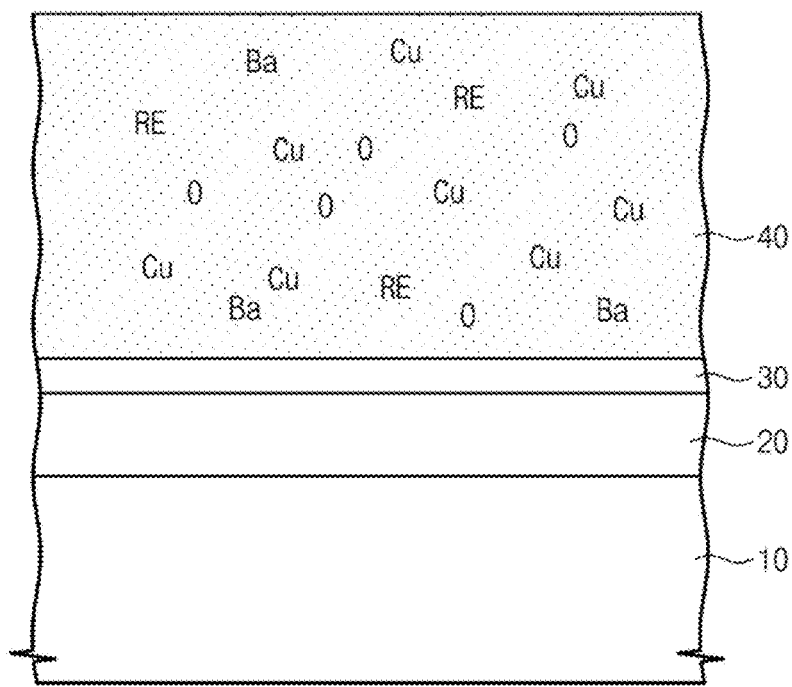

Referring to FIGS. 1 and 4, a superconductor precursor 40 is formed on the buffer layer 30 (S10). The superconductor precursor 40, for example, may include Cu, Ba, and at least one of rare earth elements (RE). The expression "rare earth elements (RE)" may be understood to include yttrium (Y) and lanthanide elements. As it is well known, the lanthanide elements include lanthanum (La), neodymium (Nd), samarium (Sm), europium (Eu), Gd, terbium (Tb), dysprosium (Dy), holmium (Ho), Erbium (Er), thulium (Tm), ytterbium (Yb), lutetium (Lu), etc.

The superconductor precursor 40 may be formed by various methods. The superconductor precursor 40, for example, may be formed by a reactive co-evaporation, pulsed laser deposition (PLD), sputtering, chemical vapor deposition (CVD), metal organic deposition (MOD), or sol-gel method. The formation of the superconductor precursor 40 is not limited to the above-described specific methods.

In one example, the superconductor precursor 40 may be formed by a reactive co-evaporation method. The reactive co-evaporation method may deposit a superconductor precursor by irradiating crucibles, in which Cu, Ba, and at least one of RE are contained, with electron beams to supply metal vapor to a substrate.

In one example, the superconductor precursor 40 may be formed by a MOD method. For example, RE-acetate, Ba-acetate, and Cu-acetate are dissolved in an organic solvent, evaporative distillation and refluxing processes are performed, and a metal precursor solution including Cu, Ba, and at least one of RE is prepared. A substrate is coated with the metal precursor solution.

In one example, the superconductor precursor 40 may be powders including Cu, Ba, and at least one of RE (e.g., Gd).

Thereafter, a pre-annealing process for the formation of an epitaxial superconductor may be performed (S20). Hereinafter, the pre-annealing process will be described in detail.

Figure 5:
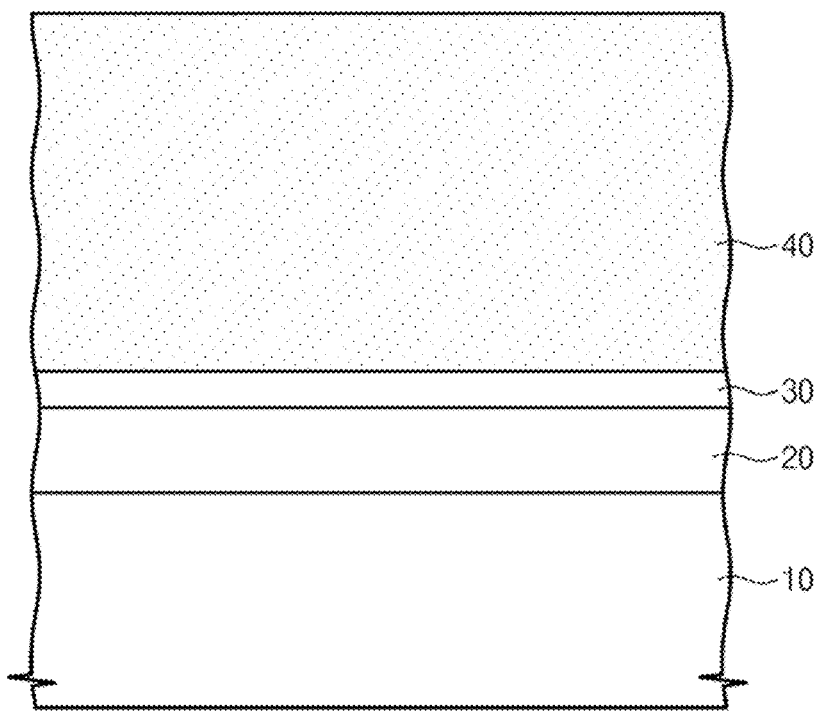

Referring to FIGS. 2 and 5, a first heat treatment is performed on the substrate 10 on which the superconductor precursor 40 is formed. The first heat treatment may be performed at an oxygen partial pressure of $10^{-3}$ Torr to $10^{-6}$ Torr. The oxygen partial pressure of the first heat treatment, for example, may be about $10^{-5}$ Torr. A temperature of the first heat treatment may be in a range of 800° C. to 1,000° C. (for example, about 860° C.). The first heat treatment may be performed along path IA of FIG. 2A. An amorphous superconductor precursor 40 may be formed on the substrate 10 by the first heat treatment.

Figure 6:
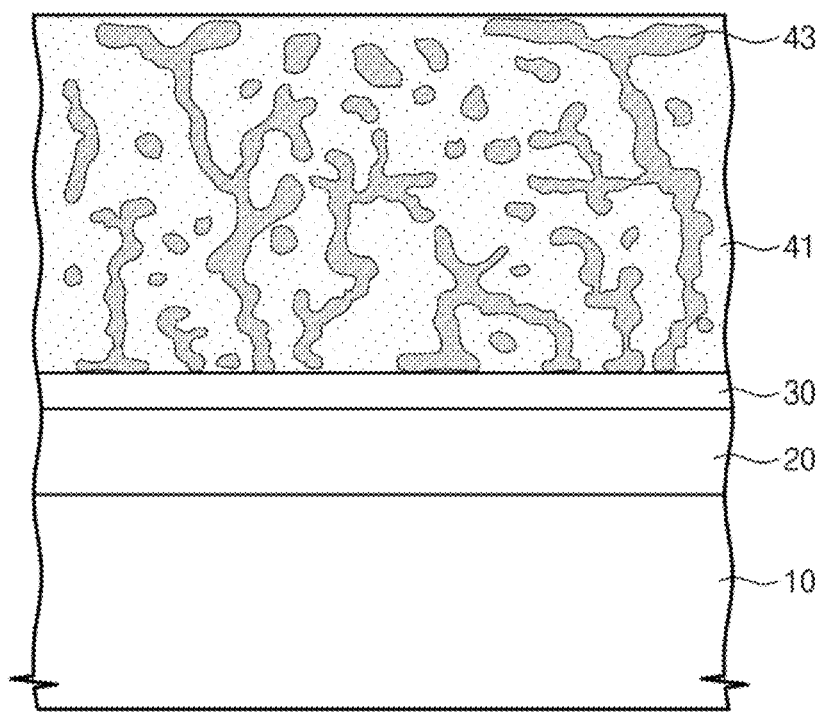

Referring to FIGS. 2 and 6, a second heat treatment is performed on the substrate 10 on which the amorphous superconductor precursor 40 is formed. The second heat treatment may be performed in a temperature range of 800° C. to 1,000° C. (for example, about 860° C.). The second heat treatment may be performed by increasing the oxygen partial pressure in comparison to the first heat treatment. The oxygen partial pressure during the second heat treatment may be increased from $10^{-5}$ Torr to $10^{-2}$ Torr to $10^{-1}$ Torr (for example, 30 mTorr). The second heat treatment may be performed along path IB of FIG. 2A. Due to the second heat treatment, the amorphous superconductor precursor 40 may be changed to a liquid-phase superconductor precursor 41 and rare earth oxide 43 (e.g., $Gd_2O_3$) may be formed in the liquid-phase superconductor precursor 41. The rare earth oxide 43 may be dendritically grown from the buffer layer 30 on the substrate 10. That is, the liquid-phase superconductor precursor 41 including the rare earth oxide 43 is formed by the second heat treatment along path IB.

Figure 7:
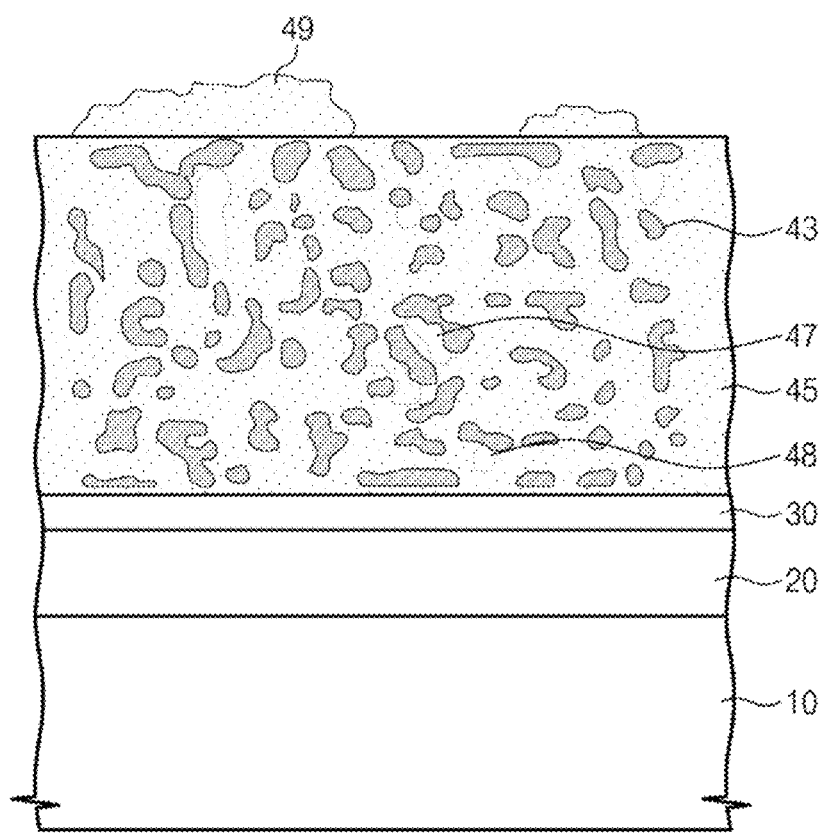

Referring to FIGS. 2 and 7, a third heat treatment is performed on the liquid-phase superconductor precursor 41 including the rare earth oxide 43. The third heat treatment may be a cooling process in which the temperature is decreased under an oxygen partial pressure of about $10^{-2}$ Torr to about $10^{-1}$ Torr (for example, 100 mTorr). A cooling rate may be 1° C./hr or more (e.g., about 5° C./hr). The third heat treatment may be performed along path IC of FIG. 2A. An epitaxial superconductor 45 of rare earth-barium-copper oxide is formed through the third heat treatment. The epitaxial superconductor 45 of rare earth-barium-copper oxide may be formed from the liquid-phase superconductor precursor 41 while consuming the rare earth element of the rare earth oxide 43. According to the above method, the epitaxial superconductor 45 having excellent crystallinity may be formed in a very fast process. The epitaxial superconductor 45 may have a $RE_{1+x}Ba_{2-x}Cu_3O_{7-\delta}$ phase ($0<x<1$, $0<\delta<1$).

In addition, the size of the rare earth oxide 43 is reduced and the rare earth oxide 43 may be changed to elongated grains. The grains of the rare earth oxide 43 may have a size of about 1 μm or less. In addition to the grains of the rare earth oxide 43, a liquid-phase residue 48 and grains of copper oxide 47 may be further formed in the epitaxial superconductor 45. Another liquid-phase residue 49 may remain on a top surface of the epitaxial superconductor 45. The liquid-phase residues 48 and 49 may result from the liquid-phase superconductor precursor 41 that is not changed to the epitaxial superconductor 45 and may be barium-copper oxide.

The grains 43 and 47 formed in the epitaxial superconductor 45 may act as flux pinning centers of the superconductor. A width of the grains of the rare earth oxide 43 may be in a range of about a few tens of nanometers to about 100 nm. The width of the grains of the rare earth oxide 43, for example, may be 100 nm or less.

Figure 8:
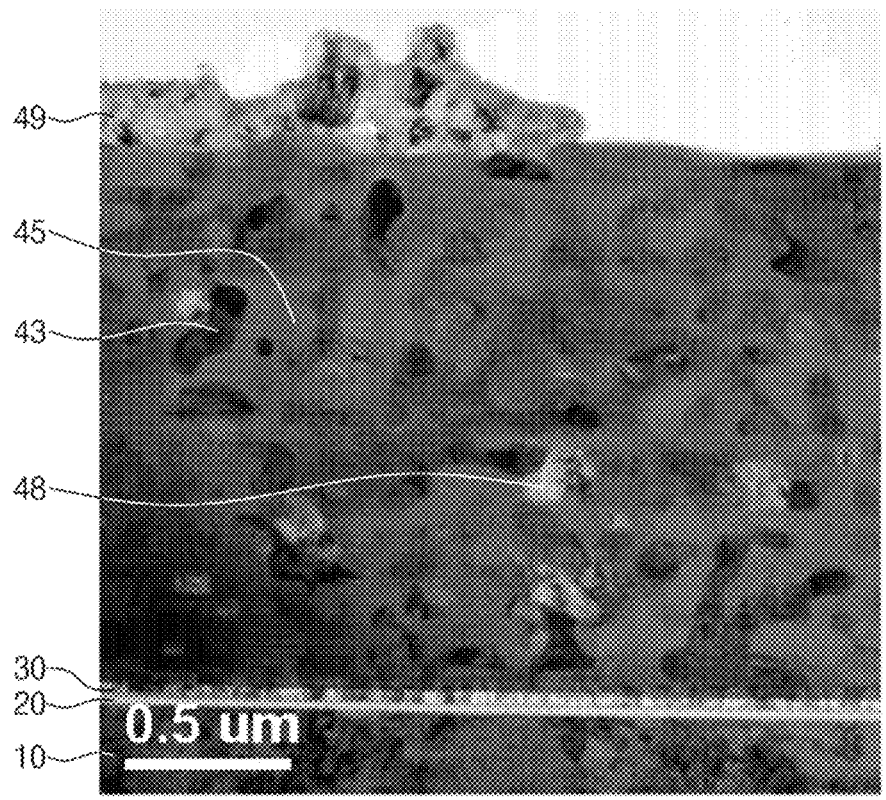
FIGS. 8 to 10 are transmission electron microscope (TEM) images of an epitaxial superconductor formed according to embodiments of the present invention.
Figure 9:
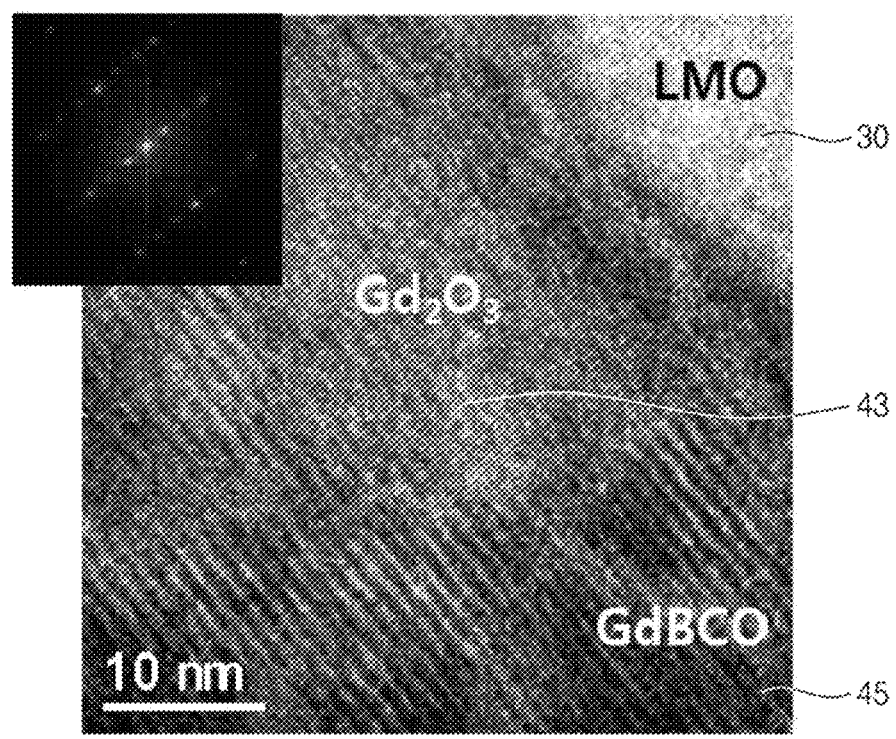
Figure 10:
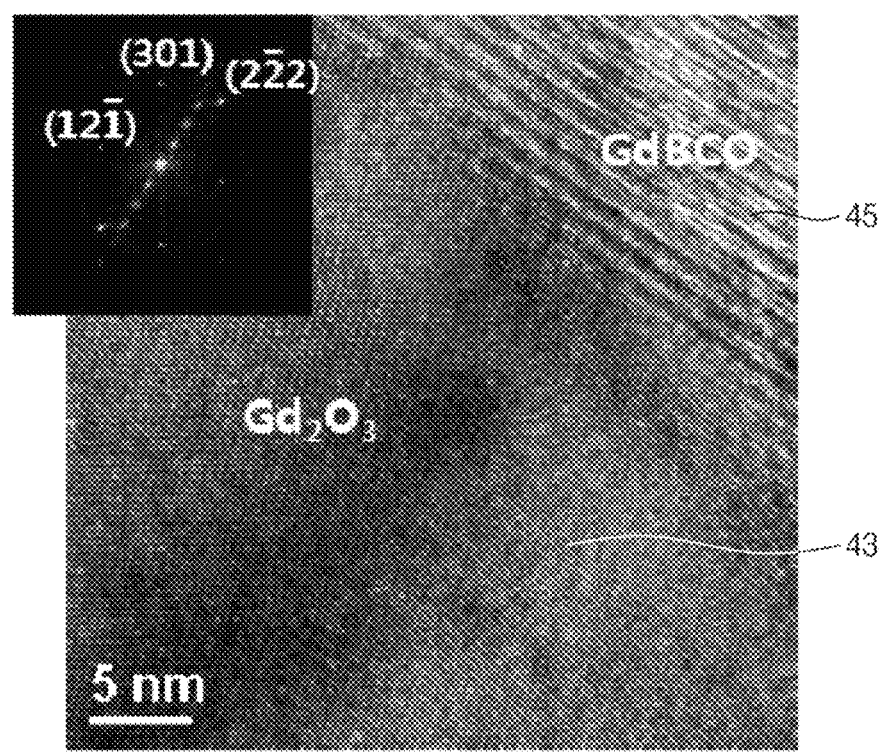

FIGS. 8 to 10 are transmission electron microscope (TEM) images of the epitaxial superconductor 45 formed according to embodiments of the present invention. FIG. 8 illustrates the epitaxial superconductor 45 formed on the substrate 10, the grains of the rare earth oxide 43 included therein, and the liquid-phase residues 48 and 49. FIGS. 9 and 10 illustrate the epitaxial superconductor 45 formed on the substrate 10 and the grain of the rare earth oxide 43 (for example, $Gd_2O_3$). The width of the grains of the rare earth oxide 43 was about a few tens of nanometers.

Figure 11:
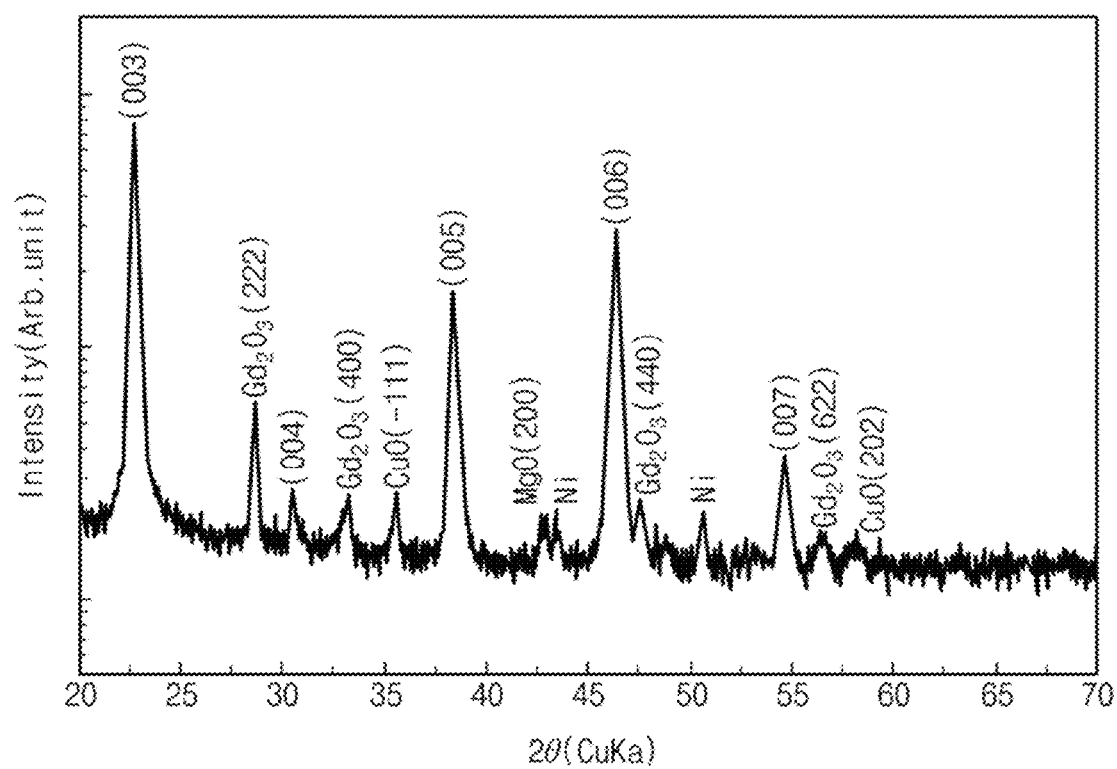
FIG. 11 is an X-ray diffraction (XRD) pattern of an epitaxial superconductor of rare earth-barium-copper oxide formed according to embodiments of the present invention.

FIG. 11 is an X-ray diffraction (XRD) pattern of the epitaxial superconductor 45 of rare earth-barium-copper oxide formed according to embodiments of the present invention. FIG. 11 illustrates good crystallinity of the epitaxial superconductor 45 of rare earth-barium-copper oxide.

A method different from the above-described embodiments may be used for the pre-annealing process (S20). For example, the pre-annealing process may be performed along path IIA and path IIB of the phase diagram of FIG. 2A. First, a first heat treatment along path IIA may be performed. The first heat treatment along path IIA, for example, may be performed under an oxygen partial pressure of $10^{-2}$ Torr to $10^{-1}$ Torr. A temperature of the first heat treatment may be increased from room temperature to about 800° C. or more (e.g., 850° C. or more). The first heat treatment along path IIA passes boundary I of the phase diagram of FIG. 2A. Accordingly, the liquid-phase superconductor precursor 41 including the rare earth oxide 43 is formed (see FIG. 6).

Next, a second heat treatment along path IIB may be performed. The second heat treatment along path IIB, for example, may be a cooling process in which the temperature is decreased under an oxygen partial pressure of $10^{-2}$ Torr to $10^{-1}$ Torr (for example, 100 mTorr). Accordingly, grains of the rare earth oxide 43 and the epitaxial superconductor 45 may be formed. The epitaxial superconductor 45 may have a $RE_{1+x}Ba_{2-x}Cu_3O_{7-\delta}$ phase ($0<x<1$, $0<\delta<1$) (see FIG. 7).

The growth processes of the epitaxial superconductor according to the above-described embodiments are similar to that of liquid phase epitaxy (LPE).

Thereafter, the post-annealing process for improving the performance of the epitaxially grown superconductor may be performed.

Figure 12:
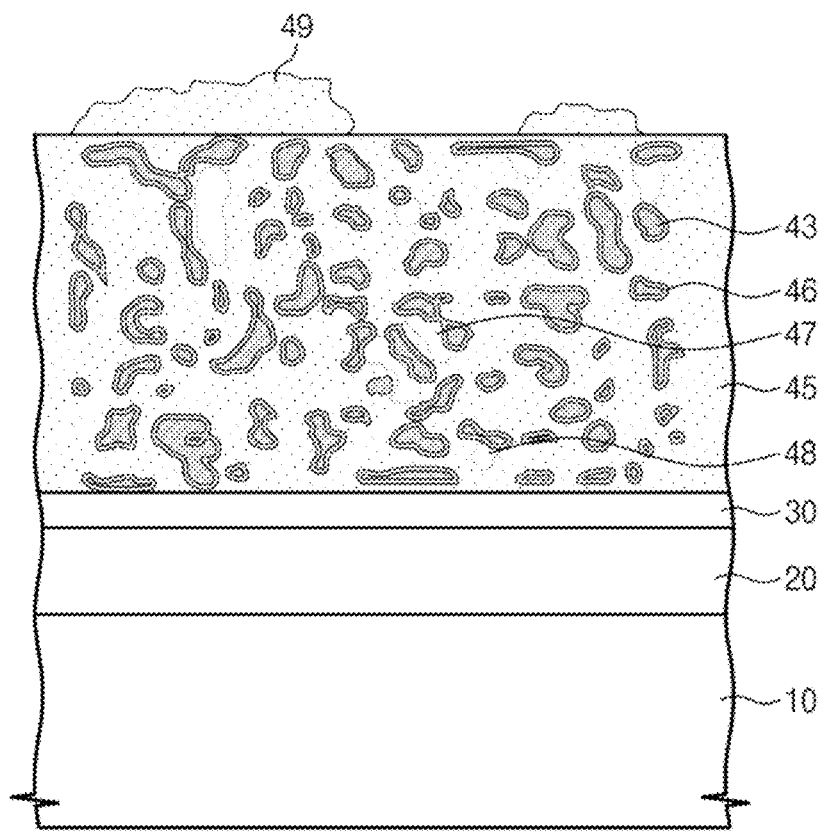

Referring to FIGS. 2B and 12, the epitaxial superconductor 45 is post-annealed. The post-annealing may be performed along path III. The post-annealing is performed in an atmosphere in which the epitaxial superconductor 45 has no liquid phase. For example, the post-annealing may be performed in a temperature range of 700° C. to 800° C. under an oxygen partial pressure of $10^{-3}$ Torr or more, about $10^{-2}$ Torr to a few Torr (for example, 300 mTorr). Copper oxide 46 (e.g., CuO or $Cu_2O$) may be formed from the epitaxial superconductor 45 by the post-annealing. In addition, the epitaxial superconductor 45 may be changed to a $RE_{1+y}Ba_{2-y}Cu_3O_{7-\delta}$ phase. In this case, x>y. That is, the copper oxide (e.g., CuO or $Cu_2O$) may be precipitated from the epitaxial superconductor 45 by the post-annealing. The copper oxide 46 may be plates that are stacked by being aligned along a c-axis direction of the epitaxial superconductor 45. In other words, the copper oxide 46 may be understood as a REBaCuO compound (e.g., $RE_{1+x}Ba_{2-x}Cu_3O_{7-\delta}$, 0<z<1) having a phase different from the epitaxial superconductor 45. Eventually, the copper oxide 46 may form stacking faults 46 in the epitaxial superconductor 45.

Figure 13A:
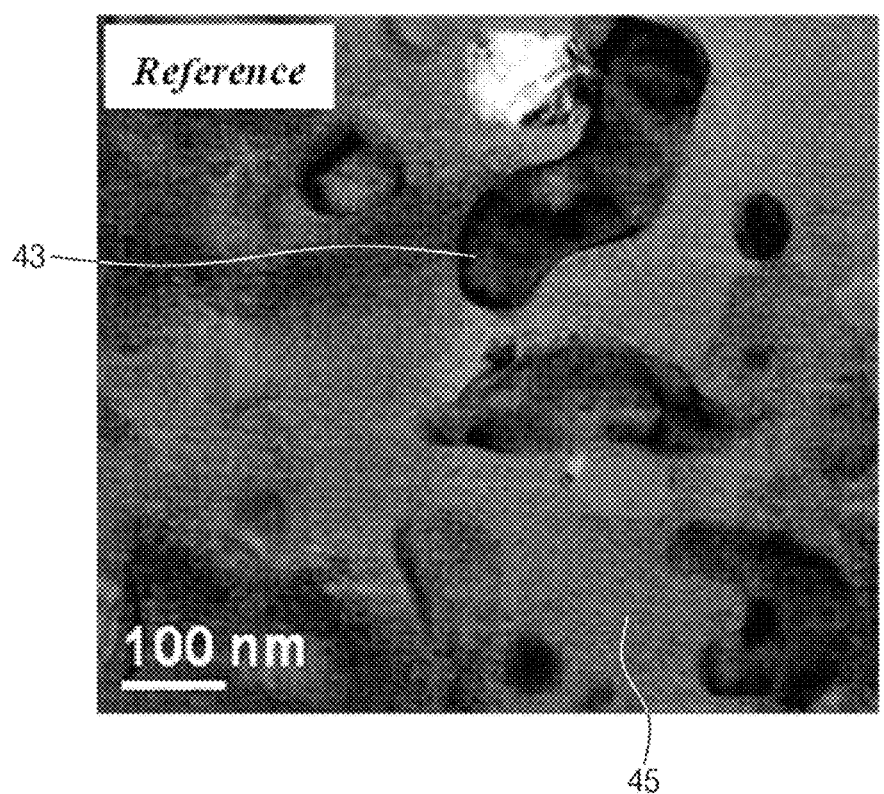
FIGS. 13A and 13B are respectively TEM images of an epitaxial superconductor before and after the post-annealing process.
Figure 13B:
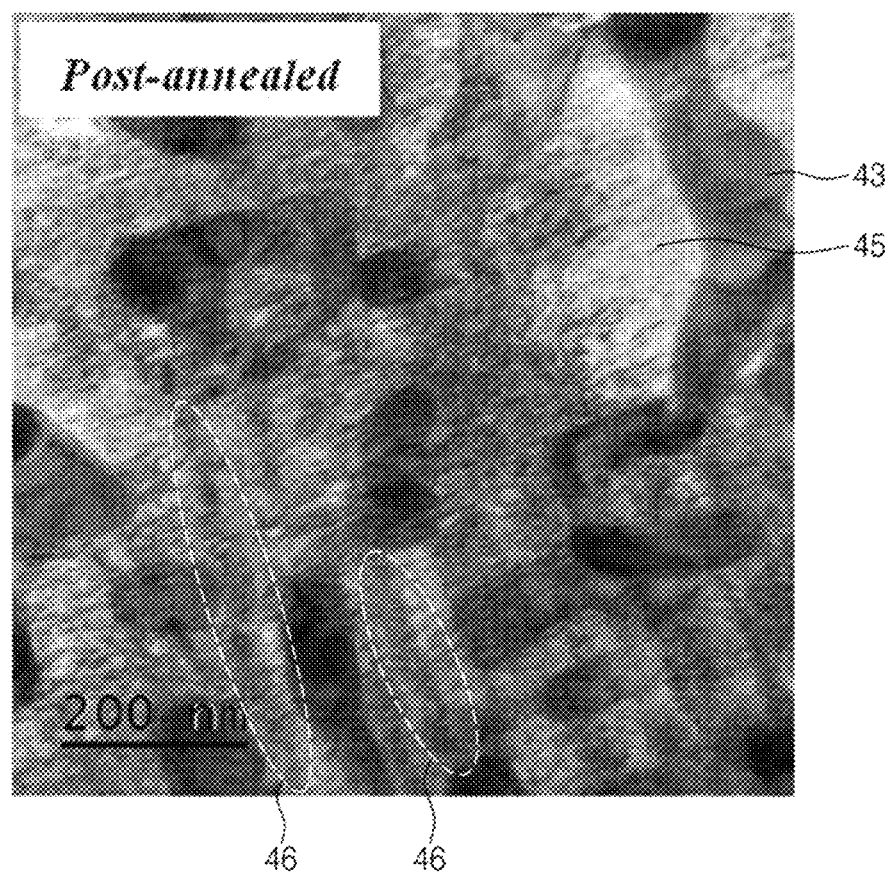

FIGS. 13A and 13B are respectively TEM images of the epitaxial superconductor 45 before and after the post-annealing process. Referring to FIGS. 13A and 13B, it may be understood that, after the post-annealing process, grains of the rare earth oxide 43 dispersed in the epitaxial superconductor 45 and the stacking faults 46 parallel to the c-axis of GdBCO are formed.

Figure 14:
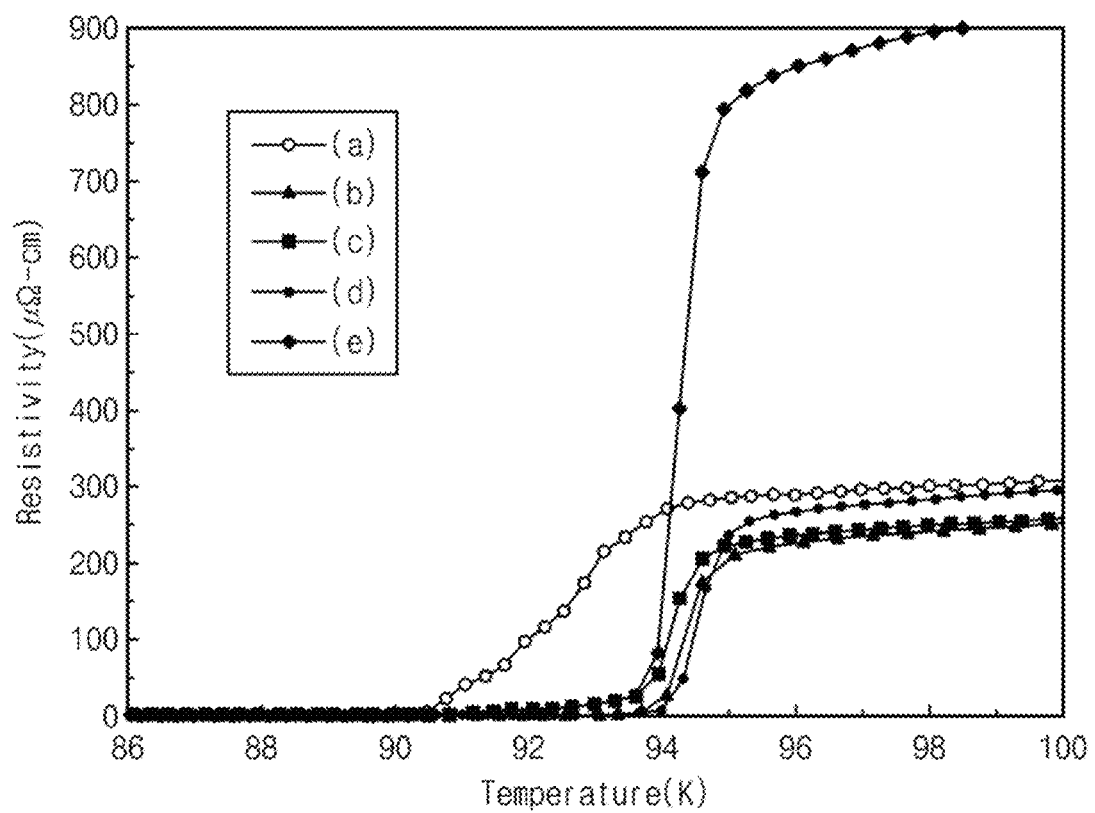
FIG. 14 illustrates critical temperature ($T_c$) characteristics of a superconductor formed according to embodiments of the present invention.

FIG. 14 illustrates critical temperature ($T_c$) characteristics of a superconductor formed according to embodiments of the present invention. FIG. 14 illustrates temperature-resistivity graphs in which (a) is a case of not performing the post-annealing, (b) is a case of performing the post-annealing at 800° C. for 5 minutes under a pressure of 300 mTorr, (c) is a case of performing the post-annealing at 800° C. for 10 minutes under a pressure of 300 mTorr, (d) is a case of performing the post-annealing at 800° C. for 30 minutes under a pressure of 300 mTorr, and (e) is a case of performing the post-annealing at 800° C. for 120 minutes under a pressure of 300 mTorr. As illustrated in FIG. 14, the critical temperature ($T_c$) was increased by about 4 K due to the post-annealing.

Figure 15:
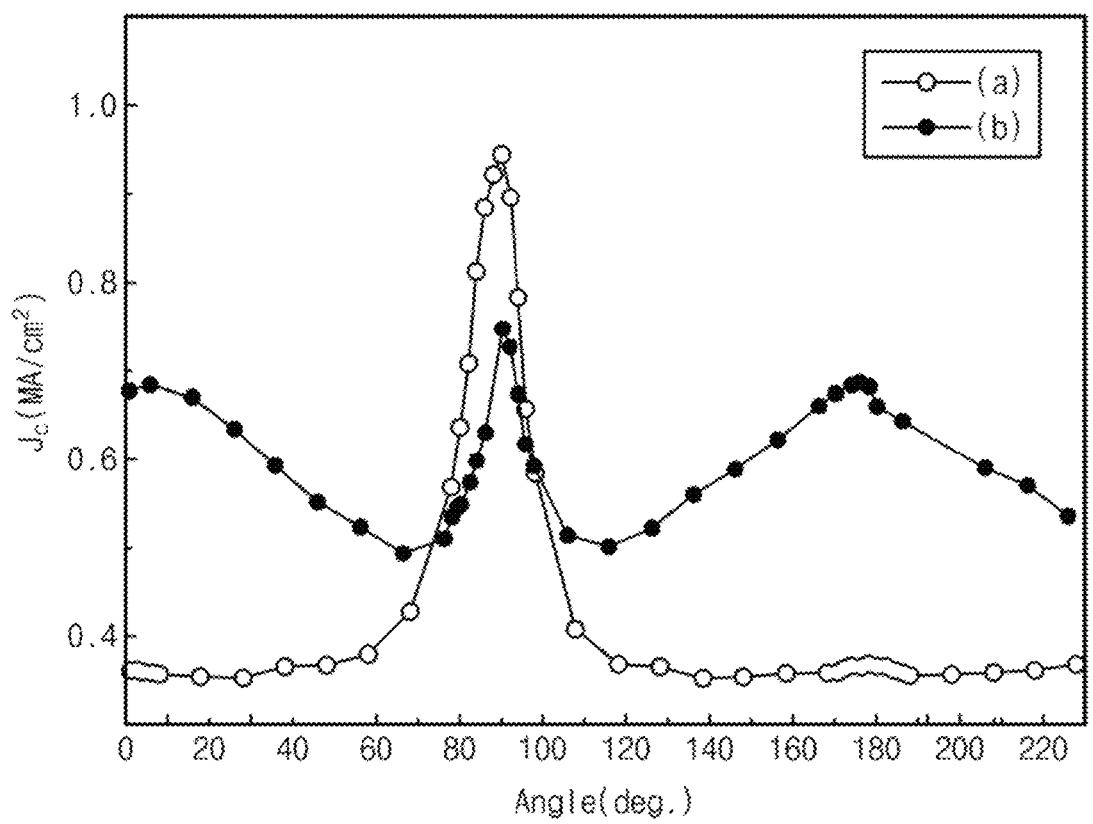
FIG. 15 illustrates critical current ($J_c$) characteristics under an externally applied magnetic field of a superconductor formed according to embodiments of the present invention.

FIG. 15 illustrates critical current ($J_c$) characteristics under an externally applied magnetic field of a superconductor formed according to embodiments of the present invention. (a) is a case of not performing the post-annealing, and (b) is a case of performing the post-annealing according to the present invention (for example, the post annealing at 800° C. for 30 minutes under a pressure of 300 mTorr). A superconducting material was GdBCO. The temperature of the measurement was 77 K and the intensity of the magnetic field was 1 tesla (T). The intensity of the magnetic field was constantly maintained and the critical current was measured while changing the direction of the magnetic field. In FIG. 15, a 0 degree angle denotes a direction in which the magnetic field is parallel to a surface of a superconducting wire, and a 90 degree angle denotes a direction in which the magnetic field is perpendicular to the surface of the superconducting wire. The magnitude of the critical current of (a) was changed by 50% or more, but the magnitude of the critical current of (b), the superconductor according to the present invention, was changed by about 20% or less according to the angle. When a current greater than the critical current flows in a superconductor, the superconductor loses its superconductivity. In power devices such as motors and generators, a magnetic field is generated by a current flowing therein and the direction of the magnetic field is difficult to be controlled. Thus, the critical current of the superconductor is determined by the lowest value according to the angle. Since changes in critical current of the superconductor according to the present invention according to the angle are very small, the superconductor according to the present invention is very suitable for power devices.

Excellent properties of the superconductor are due to the fact that rare earth oxide grains formed therein and stacking faults act as flux pinning centers of the superconductor.

Since FIGS. 2A and 2B represent the phase diagram of GdBCO, specific oxygen partial pressure and heat treatment temperature may vary according to the type of RE.

The superconductor formed by the above-described method may be a superconductor formed as a thin film on the substrate 10. The foregoing embodiments describe the formation of a superconductor layer, but the present invention is not limited thereto. It is obvious that the heat treatments of the foregoing embodiments may also be applied to a bulk superconductor. For example, amorphous rare earth-barium-copper oxide is prepared. The amorphous rare earth-barium-copper oxide may be changed to rare earth-barium-copper oxide having a single crystal structure by the above-described heat treatment process. The rare earth-barium-copper oxide having a single crystal structure may include gains of rare earth oxide dispersed and included therein, grains of barium-copper oxide, and stacking faults.

Referring to FIGS. 16 to 19, an example of a superconductor forming apparatus according to the concept of the present invention will be schematically described. The superconductor forming apparatus described with reference to FIGS. 16 to 19 is for a superconducting wire as an example according to the present invention, but the concept of the present invention is not limited thereto.

Figure 16:
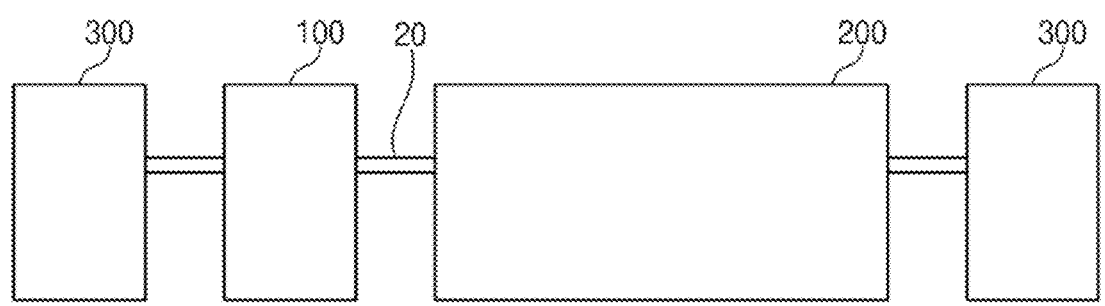
FIGS. 16 to 19 schematically illustrate an example of a superconductor forming apparatus according to the concept of the present invention.

FIG. 16 schematically illustrates a superconductor forming apparatus according to the present invention. Referring to FIG. 16, the superconductor forming apparatus includes a thin film deposition unit 100 for forming a superconductor precursor layer on a substrate, a heat treatment unit 200 for heat treating the substrate including the superconductor precursor layer formed in the thin film deposition unit 100, and a substrate supply/recovery unit 300. Vacuum loads 20, through which the substrate may pass and vacuum may be maintained, may be further provided between the thin film deposition unit 100, the heat treatment unit 200, and the substrate supply/recovery unit 300.

Figure 17:
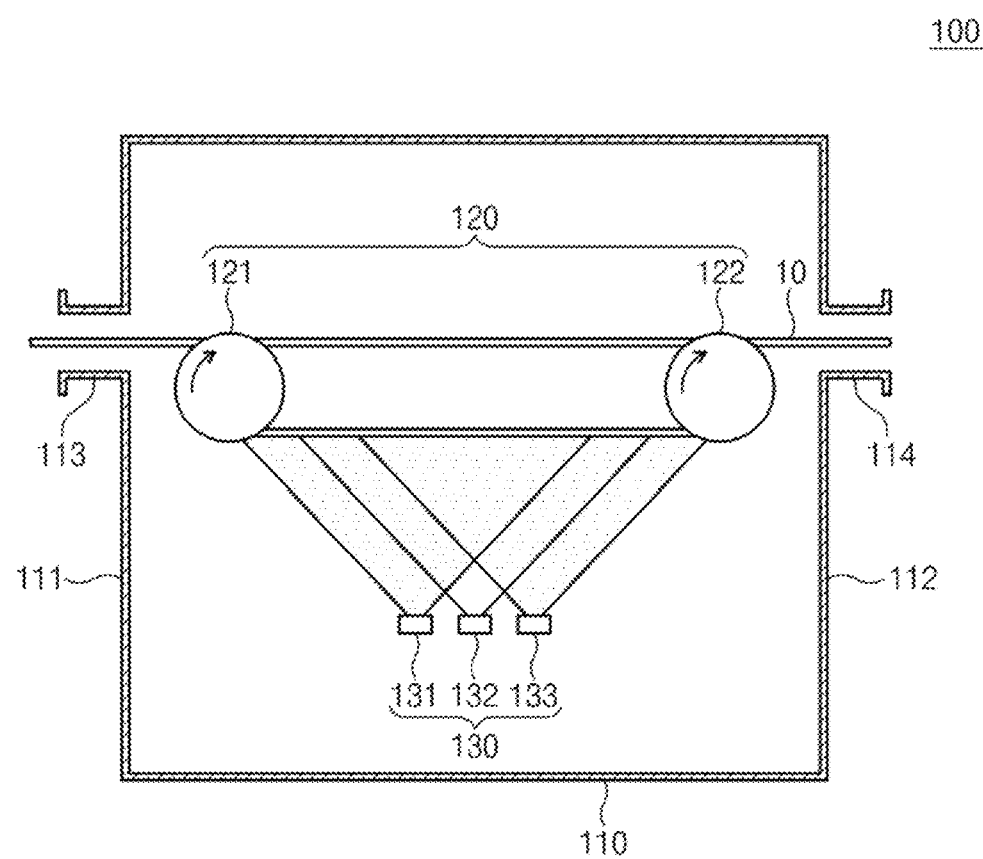

FIG. 17 schematically illustrates a cross section of the thin film deposition unit 100 of the superconductor forming apparatus according to the present invention. Referring to FIGS. 16 and 17, the thin film deposition unit 100 may include a process chamber 110, a reel-to-reel device 120, and a deposition member 130. Specifically, the process chamber 110 provides a space in which a deposition process for forming a superconductor precursor layer on the substrate 10 is performed. The process chamber 110 includes a first sidewall 111 and a second sidewall 112 that face each other. An inlet 113 connected to the substrate supply/recovery unit 300 is provided to the first sidewall 111, and an outlet 114 connected to the heat treatment unit 200 is provided to the second sidewall 112. The substrate 10 is introduced from the substrate supply/recovery unit 300 into the process chamber 110 through the inlet 113, and is introduced into the heat treatment unit 200 through the outlet 114.

The deposition member 130 may be provided under the reel-to-reel device 120. The deposition member 130 provides vapor of a superconducting material to the surface of the substrate 10. According to an embodiment of the present invention, the deposition member 130 may provide a superconductor precursor layer to the substrate 10 by using a co-evaporation method. The deposition member 130 may include metal vapor sources 131, 132, and 133, which provide metal vapors by electron beams, under the substrate 10. The metal vapor sources may include a source for a rare earth element, a source for barium, and a source for copper.

Figure 18:
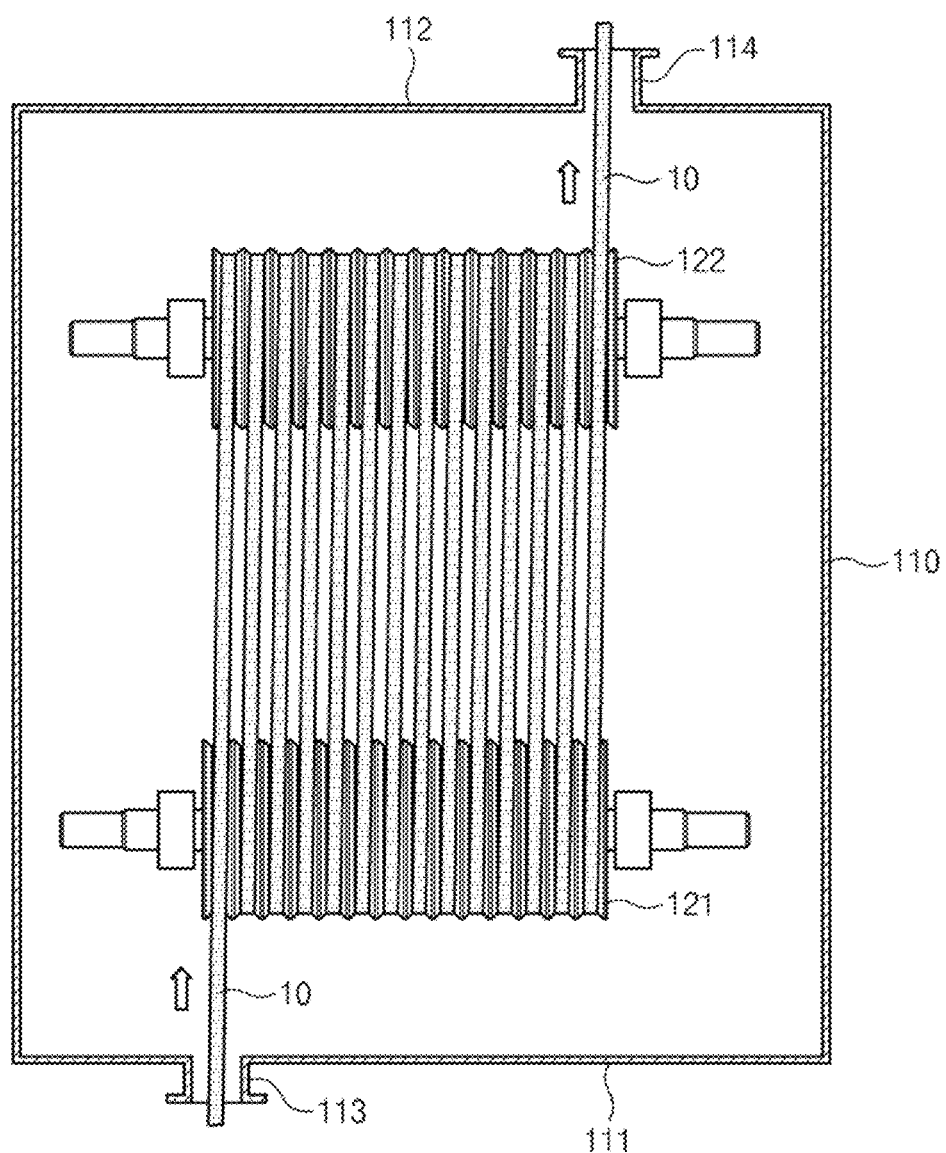

FIG. 18 illustrates a plan view of the reel-to-reel device according to the present invention. Referring to FIGS. 17 and 18, the reel-to-reel device 120 includes a first reel member 121 and a second reel member 122, and the first reel member 121 and the second reel member 122 are spaced apart and face each other. The deposition member 130 is positioned under the substrate that is disposed between the first reel member 121 and the second reel member 122. The first reel member 121 and the second reel member 122 allow the substrate 10 to be multi-turned in a region in which the deposition of the superconductor precursor layer is performed. That is, the substrate 10 is reciprocated between the first reel member 121 and the second reel member 122 and is turned by the first reel member 121 and the second reel member 122. The first reel member 121 may be provided adjacent to the first sidewall 111 of the process chamber 110, and the second reel member 122 may be provided adjacent to the second sidewall 112 of the process chamber 110. The first reel member 121 and the second reel member 122 may have the same configuration. The first reel member 121 and the second reel member 122 may extend in a direction crossing a reciprocating direction of the substrate 10.

The first reel member 121 and the second reel member 122 respectively include reels that are combined by being arranged in an extending direction of the first reel member 121 and the second reel member 122. The substrate 10 is rotated once at each reel. Each reel may be independently driven and may be rotated by the frictional force with respect to the substrate 10. In a plan view, the second reel member 122 is arranged to be slightly shifted from the first reel member 121 for the multiple turns of the substrate 10. The substrate 10 moves along the extending direction of the first reel member 121 and the second reel member 122 while reciprocating between the first reel member 121 and the second reel member 122.

Figure 19:
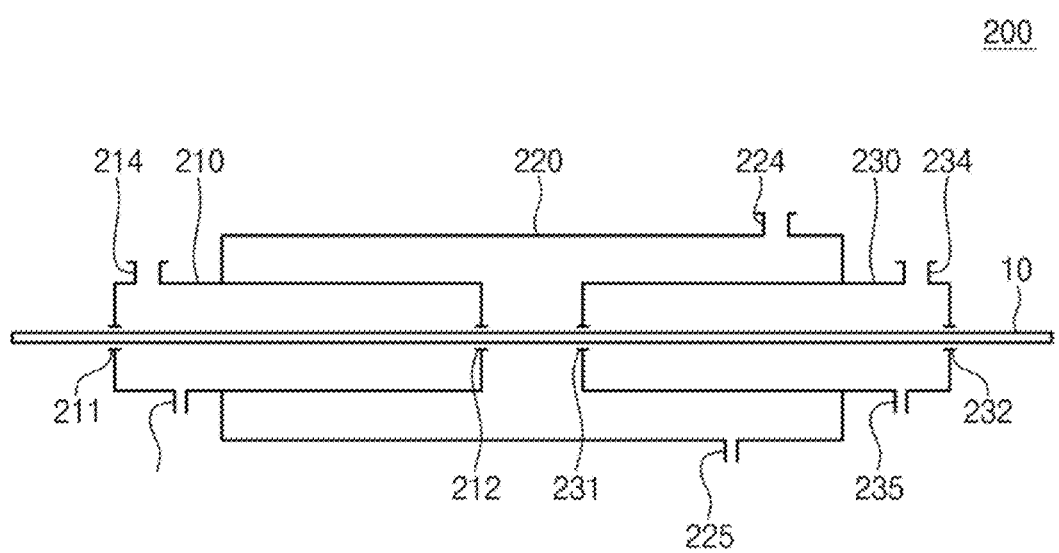

FIG. 19 is a cross-sectional view schematically illustrating the heat treatment unit 200 of the superconductor forming apparatus according to the present invention. Referring to FIG. 19, the heat treatment unit 200 may continuously pass the substrate 10 therethrough and may include a first container 210, a second container 220, and a third container 230 that are sequentially adjacent to one another. The first container 210 and the third container 230 are spaced apart from each other. A central part of the second container 220 may correspond to a space in which the first container 210 and the third container 230 are spaced apart from each other. The second container 220 is configured to surround portions of each of the first container 210 and the third container 230. The first container 210, the second container 220, and the third container 230 may be formed of a cylindrical quartz tube. The first container 210 may be connected to the outlet 114 of the thin film deposition unit 100. Inlets and outlets 211, 212, 231, and 232, through which the substrate 10 may pass, may be included at both ends of the first container and the third container. The substrate 10 may be charged through the first inlet 211 of the first container to be discharged through the first outlet 212 of the first container, may pass through the central part of the second container, and may be charged through the second inlet 231 of the third container to be discharged through the second outlet 232 of the third container.

The first container 210, the second container 220, and the third container 230 may independently maintain vacuum. For this, the first container 210, the second container 220, and the third container 230 may respectively have separate pumping ports 214, 224, and 234, and oxygen supply units (not shown). Oxygen partial pressures in the first container 210, the second container 220, and the third container 230 may be each independently controlled by supplying oxygen through the oxygen supply units. For example, the oxygen partial pressure in the first container 210 is lower than the oxygen partial pressure in the third container 230, and the oxygen partial pressure in the second container 220 may be maintained between the oxygen partial pressure in the first container 210 and the oxygen partial pressure in the third container 230. The oxygen partial pressure in the second container 220 may gradually increase from a portion adjacent to the first container 210 to a portion adjacent to the third container 230.

The first container 210, the second container 220, and the third container 230 are provided in a furnace surrounding them. A portion spaced apart from the first container 210 and the third container 230 may be disposed near the center of the furnace. Accordingly, a temperature near the center of the second container 220 may be maintained higher than temperatures in the first container 210 and the third container 230. The temperatures in the first container 210 and the third container 230 may gradually decrease from the central part of the second container 220.

The heat treatment process according to the foregoing embodiments will be described with reference to the heat treatment unit 200 of FIG. 19. Path IA may be performed while the substrate 10 passes through the first container 210 of the heat treatment unit 200. The first container 210 may have a relatively low oxygen partial pressure (for example, $1 \times 10^{-6}$ Torr to $1 \times 10^{-3}$ Torr). The temperature of the first container 210 may increase from the first inlet 211 to be about 800° C. at the first outlet 212. Path 1B may be performed while the substrate 10 passes through the central part of the second container 220 of the heat treatment unit 200. The second container 220, for example, may have an oxygen partial pressure of $1 \times 10^{-2}$ Torr to $1 \times 10^{-1}$ Torr. The oxygen partial pressure in the second container 220 may gradually increase from the portion adjacent to the first container 210 to the portion adjacent to the third container 230. The temperature of the central part of the second container 220 may be about 850° C. or more. Path IC may be performed while the substrate 10 passes through the third container 230 of the heat treatment unit 200. The third container 230, for example, may have an oxygen partial pressure of $5 \times 10^{-2}$ Torr to $3 \times 10^{-1}$ Torr. The temperature of the third container 230 may gradually decrease from about 850° C. of the second inlet 221 to the second outlet 222.

The above-described example describes that the thin film deposition unit 100, the heat treatment unit 200, and the substrate supply/recovery unit 300 are integrally configured so that the substrate 10 is continuously transferred. However, the present invention is not limited thereto.

According to an embodiment of the present invention, the substrate supply/recovery unit 300 may be separately provided to each of the thin film deposition unit 100 and the heat treatment unit 200. First, the substrate supply/recovery unit including substrates is installed in the thin film deposition unit 100. In the thin film deposition unit 100, a superconductor precursor is formed on the substrate. The thin film deposition unit 100 may have a structure different from the above-described example. For example, the thin film deposition unit 100 may be for metal organic deposition (MOD). Next, the substrate supply/recovery unit including the substrate on which the superconductor precursor is formed is separated from the thin film deposition unit 100. The substrate on which the superconductor precursor is formed may be installed in the heat treatment unit 200. Thereafter, the substrate on which the superconductor precursor is formed is heat treated.

According to another embodiment of the present invention, a substrate is not a wire type, but may be a large-area plate. In this case, the supply/recovery unit may have a structure different from the above-described example. The substrate is provided to the thin film deposition apparatus, and a superconductor precursor is formed on the substrate. The substrate, on which the superconductor precursor is formed, is heat treated in an apparatus that may perform the above-described heat treatment steps.

According to embodiments of the present invention, superconductors having excellent crystallinity may be formed in a faster process. In addition, grains of rare earth oxide and/or stacking faults that may act as flux pinning centers in a superconductor may be easily formed. Furthermore, the critical temperature ($T_c$) of the superconductor may be increased and critical current characteristics under a magnetic field may be improved.

While preferred embodiments of the present invention has been particularly shown and described with reference to the accompanying drawings, it will be understood by those of ordinary skill in the art that various changes in form and details may be made therein without departing from the spirit and scope of the present invention as defined by the following claims.

What is claimed is:

1. A method of forming a superconductor, the method comprising:
    providing a superconductor precursor including a rare earth element, barium, and copper;
    performing a pre-annealing process on the superconductor precursor to form a first superconductor in which rare earth-copper-barium oxide is epitaxially grown; and
    performing a post-annealing process on the first superconductor to form a second superconductor,
    wherein the pre-annealing process comprises:
        a first heat treatment step in which the rare earth-copper-barium oxide has a liquid phase containing grains of rare earth oxide; and
        a second heat treatment step in which the rare earth-copper-barium oxide is epitaxially grown by cooling the liquid-phase rare earth-copper-barium oxide at a lower temperature than that of the first heat treatment step, and
    wherein the post-annealing process is performed after performing the second heat treatment step and is performed at a lower temperature than that of the first heat treatment step and includes heating to a temperature that is higher than an ending temperature of the second heat treatment step.

2. The method of claim 1, wherein the first heat treatment step is performed at an oxygen partial pressure of $10^{-6}$ Torr to $10^{-1}$ Torr and a temperature of 800° C. or more.

3. The method of claim 2, wherein the second heat treatment step is performed at an oxygen partial pressure of $10^{-3}$ Torr to $10^{-1}$ Torr and a temperature of 800° C. or less.

4. The method of claim 3, wherein the post-annealing process is performed in a temperature range of 700° C. to 800° C. under an oxygen partial pressure of $10^{-3}$ Torr or more.

5. The method of claim 1, wherein the rare earth-copper-barium oxide of the epitaxially grown first superconductor is formed from the rare earth oxide.

6. The method of claim 5, wherein the first superconductor comprises grains of rare earth oxide that are dispersed therein.

7. The method of claim 6, wherein the second superconductor comprises grains of rare earth oxide that are dispersed therein and stacking faults of copper oxide.

8. The method of claim 6, wherein the rare earth oxide is $RE_2O_3$, the first superconductor has a $RE_{1+x}Ba_{2-x}Cu_3O_{7-\delta}$ phase, the second superconductor has a $RE_{1+y}Ba_{2-y}Cu_3O_{7-\delta}$ phase, and x>y,
    wherein RE comprises yttrium (Y) or at least one of lanthanide elements including lanthanum (La), neodymium (Nd), samarium (Sm), europium (Eu), gadolinium (Gd), terbium (Tb), dysprosium (Dy), holmium (Ho), Erbium (Er), thulium (Tm), ytterbium (Yb), and lutetium (Lu).

9. The method of claim 7, wherein the second superconductor further comprises $RE_2BaCuO_5$.

10. The method of claim 1, wherein the rare earth-copper-barium oxide is formed on a tape-shaped substrate, and
    the substrate comprises an oxide buffer layer formed on a metal substrate having a textured structure.

11. The method of claim 1, wherein performing the post-annealing process including forming stacking faults of copper oxide in the rare earth-barium-copper oxide to act as flux pinning centers of the superconductor.

12. A method of forming a superconductor, the method comprising:
    a first step of forming liquid-phase rare earth-copper-barium oxide by heat treating a superconductor precursor including a rare earth element, barium, and copper;
    a second step of forming a first superconductor of the rare earth-copper-barium oxide that is epitaxially grown from the liquid-phase rare earth-copper-barium oxide; and
    a third step of forming a second superconductor of the rare earth-copper-barium oxide by heat treating the first superconductor,
    wherein the heat treatment of the third step is performed in an atmosphere in which the rare earth-copper-barium oxide has no liquid phase, and
    wherein stacking faults of copper oxide are formed in the rare earth-barium-copper oxide and act as flux pinning centers of the superconductor.

13. A superconductor comprising:
    epitaxially grown rare earth-barium-copper oxide;
    grains of rare earth oxide that are included in the rare earth-barium-copper oxide; and
    stacking faults of copper oxide that are included in the rare earth-barium-copper oxide and are stacked by being aligned in a c-axis direction of the epitaxially grown rare earth-barium-copper oxide.

14. The superconductor of claim 13, wherein the rare earth oxide is $RE_2O_3$ and the rare earth-barium-copper oxide has a $RE_{1+y}Ba_{2-y}Cu_3O_{7-\delta}$ phase,
    wherein RE comprises yttrium (Y) or at least one of lanthanide elements including lanthanum (La), neodymium (Nd), samarium (Sm), europium (Eu), gadolinium (Gd), terbium (Tb), dysprosium (Dy), holmium (Ho), Erbium (Er), thulium (Tm), ytterbium (Yb), and lutetium (Lu).

15. The superconductor of claim 14, further comprising rare earth-barium-copper oxide having a $RE_2BaCuO_5$ phase.

16. A superconducting wire comprising:
    a substrate; and
    a thin film of the superconductor of claim 13 that is formed on the substrate.

17. The superconducting wire of claim 16, wherein the substrate comprises an oxide buffer layer formed on a metal substrate having a textured structure.

* * * * *